(12) United States Patent
Watanabe

(10) Patent No.: US 6,876,057 B2
(45) Date of Patent: Apr. 5, 2005

(54) SEMICONDUCTOR DEVICES INCLUDING FUSES AND DUMMY FUSES

(75) Inventor: Kunio Watanabe, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/243,297

(22) Filed: Sep. 13, 2002

(65) Prior Publication Data

US 2003/0085445 A1 May 8, 2003

(30) Foreign Application Priority Data

Sep. 13, 2001 (JP) .......................... 2001-278627

(51) Int. Cl.$^7$ ............................................ H01L 29/00
(52) U.S. Cl. ....................................................... 257/529
(58) Field of Search ................................ 257/529, 209, 257/173, 665, 910

(56) References Cited

U.S. PATENT DOCUMENTS 5,914,524 A * 6/1999 Komenaka .................. 257/529
6,259,147 B1 * 7/2001 Iwamoto et al. ............ 257/529
6,376,894 B1 * 4/2002 Ikegami et al. ............. 257/529
2003/0011042 A1 * 1/2003 Kagiwata .................... 257/529

FOREIGN PATENT DOCUMENTS

JP           363055955      *   3/1988    ........... H01L/21/82
JP           409270425  A   * 10/1997    ....... H01L/21/3205

* cited by examiner

Primary Examiner—Mary Wilczewski
Assistant Examiner—Monica Lewis
(74) Attorney, Agent, or Firm—Konrad Raynes & Victor, LLP; Alan S. Raynes

(57) ABSTRACT

A semiconductor device may include a fuse section 100 having a layer in which a plurality of fuses 26 that are fusible by irradiation of an energy beam are formed, and a circuit wiring layer 200 formed in the fuse section 100. The circuit wiring layer 200 is disposed in a layer below the layer in which the fuses 26 are formed, and is not connected to the fuses 26.

15 Claims, 5 Drawing Sheets

SEMICONDUCTOR DEVICES INCLUDING FUSES AND DUMMY FUSES

Applicant claims priority in and hereby incorporates by reference Japanese Application No. 2001-278627, filed Sep. 13, 2001, in its entirety.

TECHNICAL FIELD

The present invention relates to semiconductor devices including fuses that are fusible by irradiation of an energy beam such as a laser beam.

RELATED ART

Substitute circuits are built in semiconductor devices in order to replace circuits that have become defective due to deficiencies that could occur during the manufacturing process. For example, in the case of a semiconductor memory device, since many of the deficiencies that occur during the manufacturing process would occur in its memory section, multiple redundant memory cells in units of word lines or bit lines are generally disposed therein. A redundant circuit controls the redundant memory cells. When a deficient element is generated in one chip that forms a semiconductor device, the redundant circuit provides a function to switch the deficient element to a normal element by irradiating a laser beam to a fuse element having an address corresponding to the deficient element to thereby fuse the fuse element.

FIG. 5 shows an example of a circuit layout of a semiconductor memory device, and FIG. 6 shows an enlarged view of a region E in FIG. 5. In the example shown in FIG. 5, memory cell arrays 300 and a decoder 400 are disposed adjacent to one another, and fuse sections 500 are disposed between the memory cell arrays 300 and decoder 400 and a peripheral circuit 600. Further, as indicated in FIG. 6, wiring layers 700 such as signal lines are disposed between the adjacent fuse sections 500. In this manner, in the conventional circuit layout, the fuse sections 500 and the wiring layers 700 such as signal lines are formed in different regions. This imposes restrictions upon designing the circuit layout.

SUMMARY

Embodiments relate to a semiconductor device including a fuse section having a layer with a plurality of fuses formed therein that are fusible by irradiation of an energy beam. The device also includes a circuit wiring layer formed in the fuse section. The circuit wiring layer is disposed in a layer below the layer in which the fuses are formed, and is not connected to the fuses.

Embodiments also relate to a semiconductor device including a fuse section including a layer with a plurality of fuses formed therein. The device also includes a circuit wiring layer formed in the fuse section. The circuit wiring layer is disposed in a layer other than the layer in which the plurality of fuses are formed, and is not in electrical contact with the fuses.

BRIEF DESCRIPTION OF THE DRAWINGS

Embodiments of the invention are described with reference to the accompanying drawings which, for illustrative purposes, are schematic and not necessarily drawn to scale.

DETAILED DESCRIPTION

Figure 1:
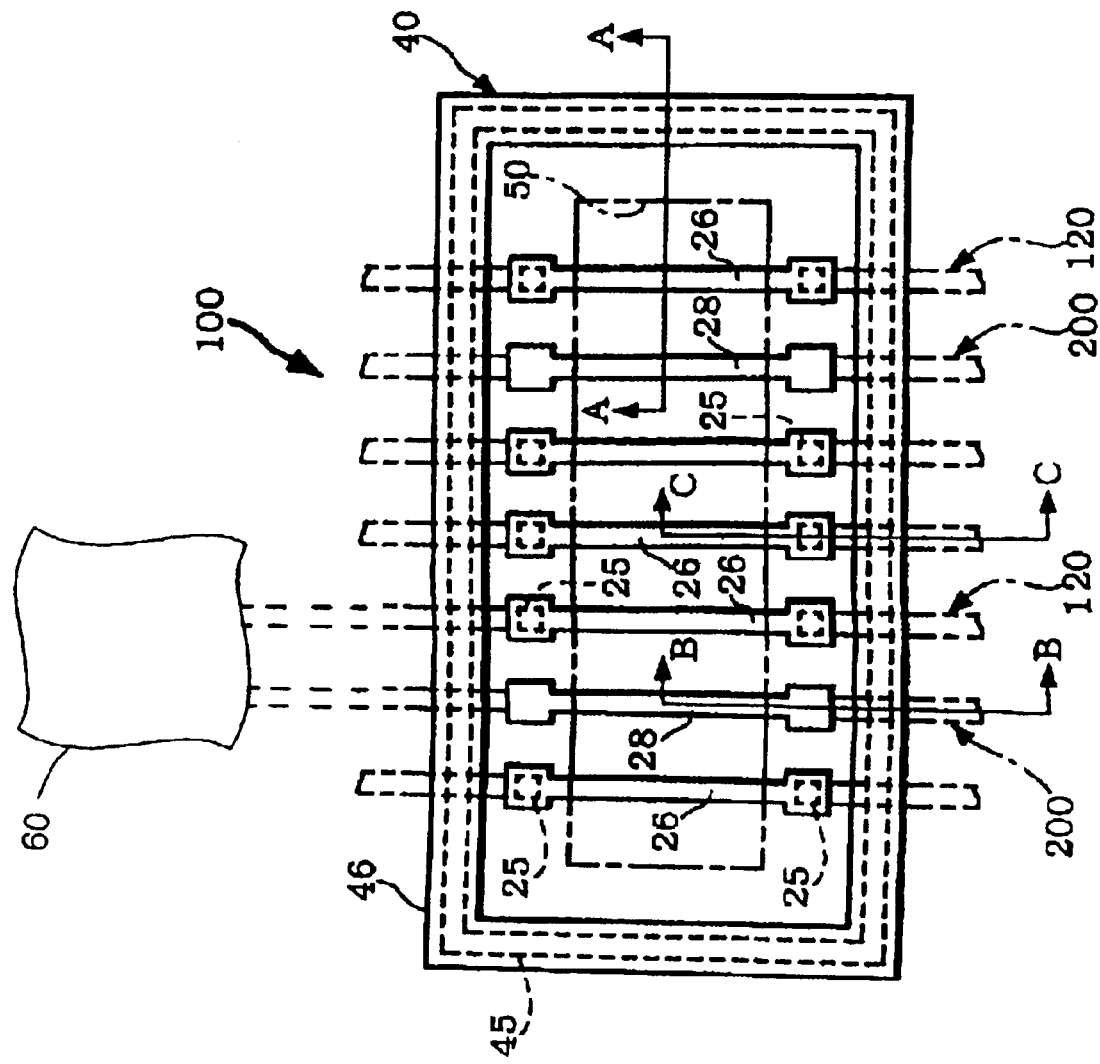
FIG. 1 schematically shows a plan view of a key portion of a semiconductor device in accordance with an embodiment of the present invention.

It is an object of certain embodiments of the present invention to provide semiconductor devices that can effectively use semiconductor substrates and improve the degree of freedom in the layout design.

A semiconductor device in accordance with certain embodiments of the present invention comprises:
  a fuse section having a layer with a plurality of fuses formed therein that are fusible by irradiation of an energy beam; and
  a circuit wiring layer formed in the fuse section,
    wherein the circuit wiring layer is disposed in a layer below the layer in which the fuses are formed, and is not connected to the fuses.

With the semiconductor device as described above, since the circuit wiring layer is disposed in the fuse section, the area occupied by the circuit wiring layer alone can be reduced, compared to the case in which a fuse section and a circuit wiring layer are provided in different regions. As a result, the degree of freedom in designing the circuit is improved.

The circuit wiring layer means a wiring layer that is not connected to the fuses, and functions as a wiring for the circuit section. Such a circuit wiring layer is not particularly limited, but is applicable to, for example, signal lines for various circuits, power supply lines, grounding lines, and the like. The various circuits may include semiconductor memory circuits such as DRAMs, SRAMs and flash memories, liquid crystal driver circuits, and analog circuits in which capacitors and resistor elements are formed.

The semiconductor device described above may be implemented in certain embodiments exemplified below.

(a) It may further comprise a circuit section with two or more wiring layers on a semiconductor substrate, wherein the fuses and the circuit wiring layer are formed in layers at the same levels of corresponding ones of the wiring layers comprising the circuit section, respectively. By this structure, at least the fuses and the circuit wiring layer can be formed in the same steps as those for forming wiring layers in the circuit section.

(b) The circuit wiring layer may be formed to extend in a direction that is the same as a direction in which the fuses extend.

(c) Electrically isolated dummy fuses may be disposed in a region corresponding to the circuit wiring layer in the layer where the fuses are formed. Since the dummy fuses are disposed in a region corresponding to the region where the circuit wiring layer is disposed, this structure can avoid an impact of the irradiation of energy beam on a wiring layer below the layer wherein the dummy fuses are formed.

(d) The circuit wiring layer can be formed in any layer that is below the layer in which the fuses are formed. For example, the circuit wiring layer can be formed from a structure including a first conductive layer that is electrically connected to other conductive layers as viewed from the semiconductor substrate. In this case, the circuit wiring layer can be composed of material containing polysilicon as a main composition. When the circuit wiring layer is composed of a polysilicon layer, the semiconductor device may further include, at least in the fuse section, a metal wiring layer disposed in a layer different from the circuit wiring layer and connected to the circuit wiring layer. In this structure, since the circuit wiring layer is connected to the metal wiring layer in the fuse section, the resistance of the circuit wiring layer may be further reduced.

Certain embodiments of the present invention are described below with reference to the accompanying drawings.

Figure 2:
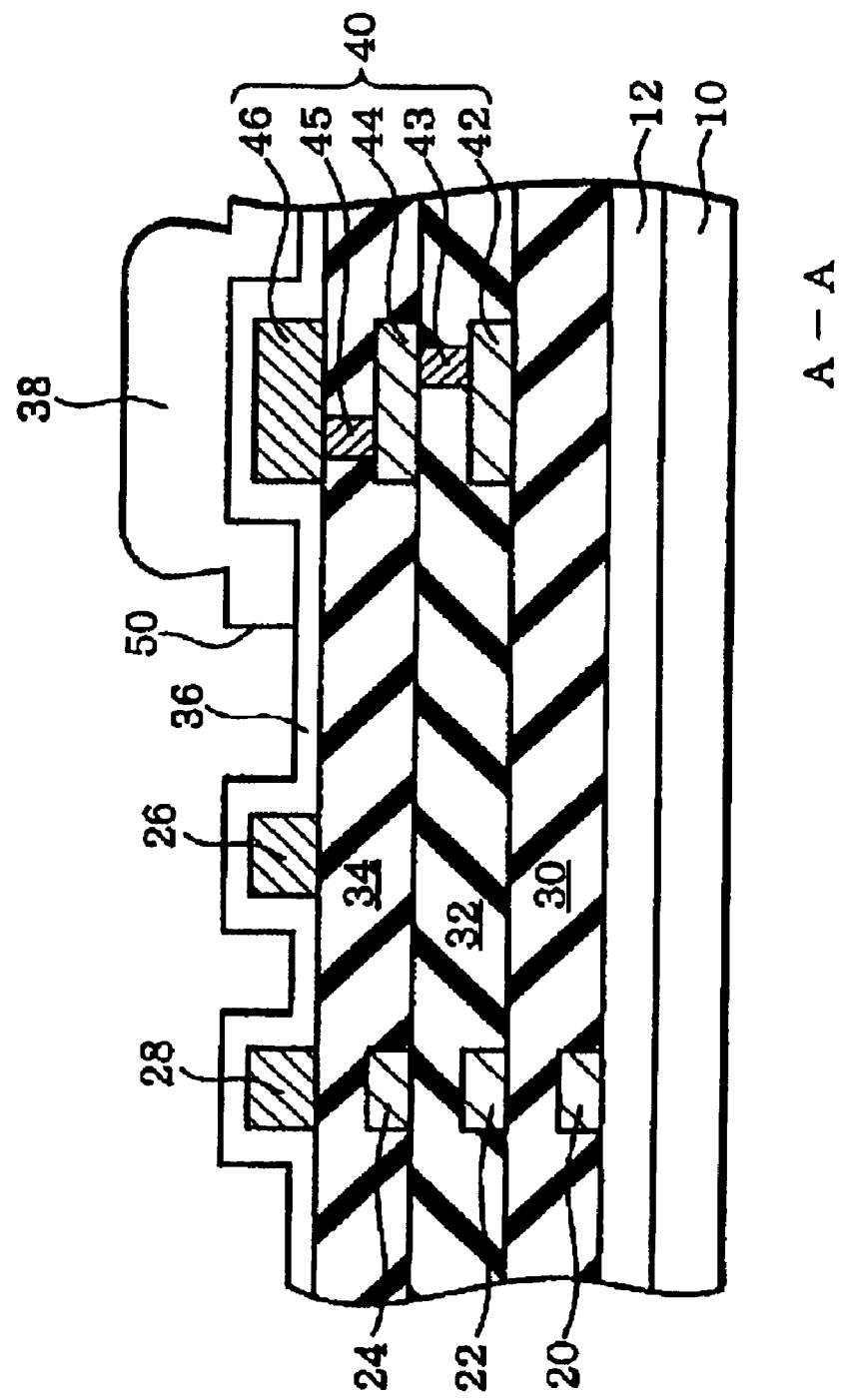
FIG. 2 is a cross-sectional view of a portion taken along a line A—A in FIG. 1.
Figure 3:
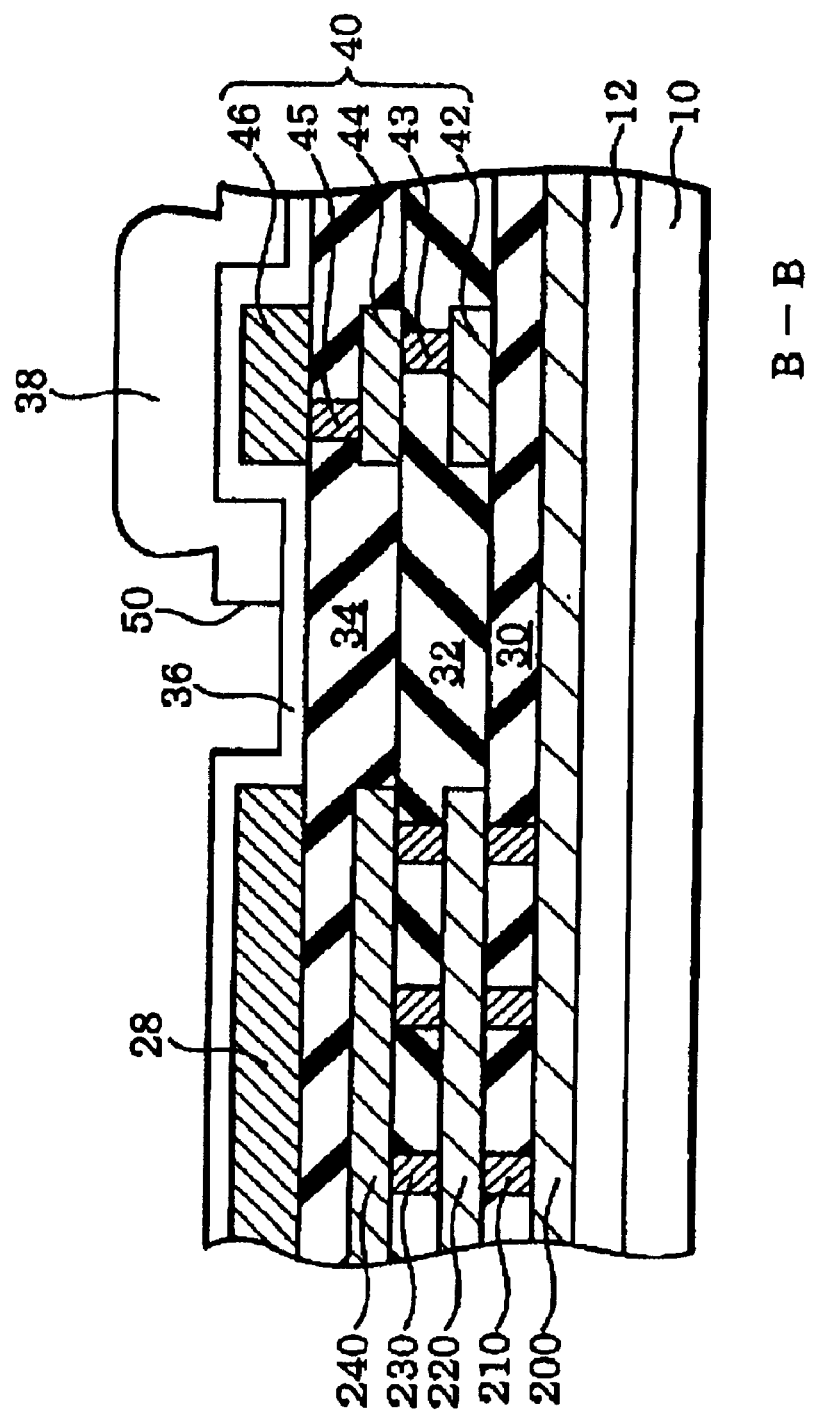
FIG. 3 is a cross-sectional view of a portion taken along a line B—B in FIG. 1.
Figure 4:
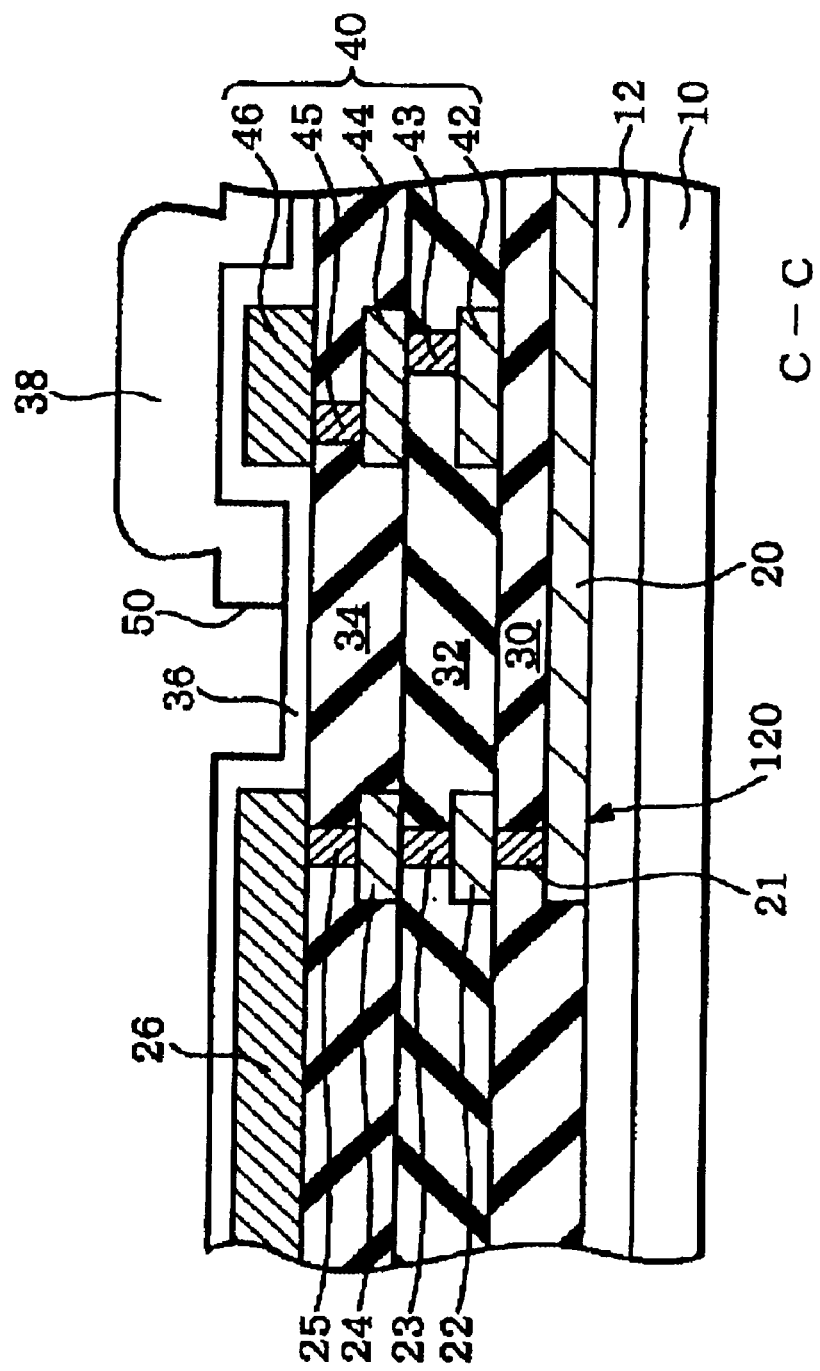
FIG. 4 is a cross-sectional view of a portion taken along a line C—C in FIG. 1.
Figure 5:
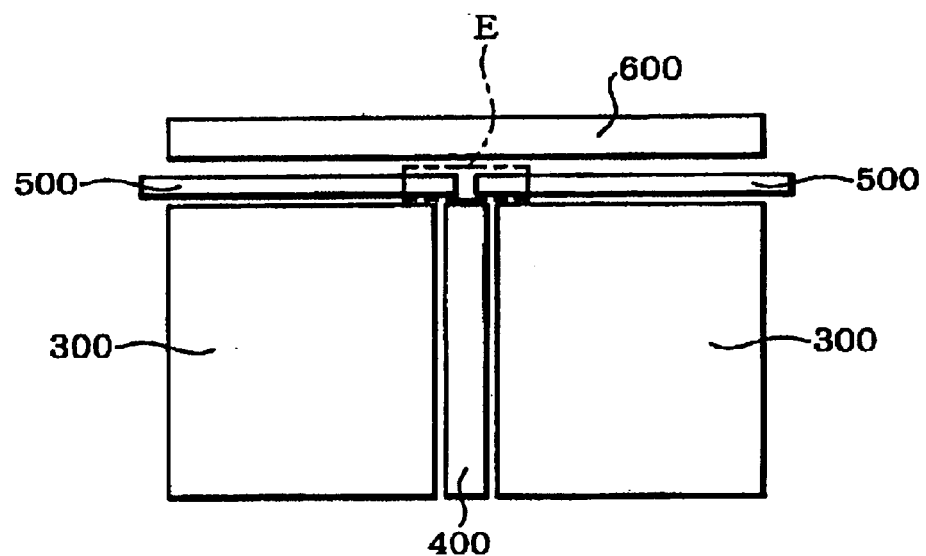
FIG. 5 shows an example of a circuit layout of a conventional semiconductor memory device.
Figure 6:
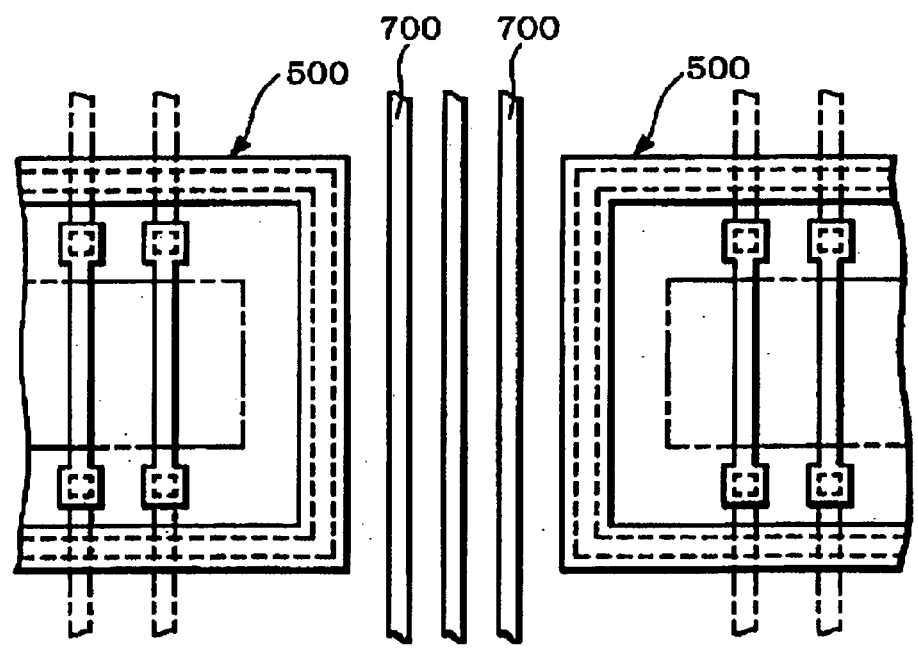
FIG. 6 shows an enlarged view of a region E in FIG. 5.

FIGS. 1 through 4 schematically show a semiconductor device in accordance with an embodiment of the present invention. FIG. 1 schematically shows a plan view of a key portion of the semiconductor device in accordance with an embodiment of the present invention. FIG. 2 is a cross-sectional view of a portion taken along a line A—A in FIG. 1. FIG. 3 is a cross-sectional view of a portion taken along a line B—B in FIG. 1. FIG. 4 is a cross-sectional view of a portion taken along a line C—C in FIG. 1.

The semiconductor device in accordance with the present embodiment includes a fuse section 100, and a circuit section 60. The fuse section 100 includes, as shown in FIG. 1, a plurality of fuses 26 and a guard ring 40 that surrounds the fuses 26. Further, circuit wiring layers 200 that function as wirings of the circuit section 60 are disposed in the fuse section 100.

The fuses 26, as shown in FIG. 1, are disposed at predetermined pitches, and comprise material that can be fused by an energy beam such as a laser beam. Such a material is not particularly limited, but metal such as aluminum and copper, or material whose main composition is polysilicon, are examples which may be used.

Also, in the present embodiment, the fuse sections 26 are, as shown in FIG. 4, connected to a circuit section (such as circuit section 60 as shown in FIG. 1 or another circuit section) by a fuse wiring layer 120. The fuse wiring layer 120 is formed from a first wiring layer 20, a second wiring layer 22 and a third wiring layer 24, and a first contact layer 21, a second contact layer 23 and a third contact layer 25 which mutually connect the wiring layers. The fuses 26, as shown in FIG. 4, are disposed as uppermost fuse wiring layers.

In the present embodiment, the first wiring layer 20 that comprises the fuse wiring layer 120 is formed on a substrate 10 through an element isolation dielectric layer 12 and is composed of a conductive layer containing polysilicon as a main composition. As the first wiring layer 20, a wiring layer formed from a known material such as a polysilicon layer, a polycide layer in which a silicide layer is deposited on a polysilicon layer, or the like can be used. This similarly applies to wiring layers that are to be described below.

The second wiring layer 22 and the third wiring layer 24 that comprise the fuse wiring layer 120 may include wiring layers containing metal as a main composition. The metal wiring layers are not particularly limited, but known wiring layer materials containing metal such as aluminum, copper or the like as a main composition can be used. This similarly applies to wiring layers that are to be described below. A first interlayer dielectric layer 30 is formed between the first wiring layer 20 and the second wiring layer 22. Similarly, a second interlayer dielectric layer 32 is formed between the second wiring layer 22 and the third wiring layer 24, and a third interlayer dielectric layer 34 is formed between the third wiring layer 24 and the wiring layer including the fuses 26.

The first wiring layer 20, the second wiring layer 22 and the third wiring layer 24 are preferably located at the same levels as a first wiring layer, a second wiring layer and a third wiring layer in the circuit section 60, respectively, and may be formed in the same steps in which these layers are formed.

The circuit wiring layer 200, as shown in FIGS. 1 and 3, may extend along the same direction in which the fuses 26 extend. Further, electrically isolated dummy fuses 28 are disposed in a region that corresponds to the circuit wiring layer 200. The dummy fuses 28 are, as shown in FIG. 3, insulated from the third wiring layer 240 by the third interlayer dielectric layer 34. The dummy fuses 28 may be formed in the same steps in which the fuses 26 are formed, and have the same configuration as that of the fuses 26. Also, the dummy fuses 28 may be disposed at the same pitch as that of the fuses 26.

The circuit wiring layer 200 comprises a conductive layer preferably containing polysilicon as a main composition, which is formed on the substrate 10 through the element isolation dielectric layer 12 as shown in FIG. 3. The circuit wiring layer 200 is disposed at the same level as that of the first conductive layer 20 that comprises the fuse wiring layer 120.

The circuit wiring layer 200 is connected to the second wiring layer 220 and the third wiring layer 240 that are disposed above the circuit wiring layer 200. More specifically, the circuit wiring layer 200 and the second wiring layer 220 are connected to each other through a plurality of contact layers 210 that are formed in the first interlayer dielectric layer 30. The second wiring layer 220 and the third wiring layer 240 are connected to each other through a plurality of contact layers 230 that are formed in the second interlayer dielectric layer 32. The second wiring layer 220 is provided in a layer at the same level of the second wiring layer 22 that composes the fuse wiring layer 120, and the third wiring layer 240 is provided in a layer at the same level of the third wiring layer 24 that comprises the fuse wiring layer 120. The second wiring layer 220 and the third wiring layer 240 are formed in a region corresponding to the region where the dummy fuses 28 are formed.

The guard ring 40 is preferably formed from a plurality of wiring layers and a plurality of via layers that are continuous in a shape surrounding the fuses 26. More specifically, in the present embodiment, as shown in FIGS. 1–3, the guard ring 40 is formed from a first metal wiring layer 42, a second metal wiring layer 44 and a third metal wiring layer 46, which are continuous in along an outer circumference of the fuse section 100.

The first metal wiring layer 42 is located in the same layer as the second wiring layers 22 and 220, and is formed in the same steps in which these layers are formed. Similarly, the second metal wiring layer 44 is located in the same layer as the third wiring layers 24 and 240, and is formed in the same steps in which these layers are formed. The third metal wiring layer 46 is located in the same layer as the fuses 26 and the dummy fuses 28, and is formed in the same steps in which these layers are formed.

A via layer 43 that is continuous in a ring shape is formed between the first metal wiring layer 42 and the second metal wiring layer 44, as shown in FIG. 1, and a via layer 45 that is continuous in a ring shape is formed between the second metal wiring layer 44 and the third metal wiring layer 46. The via layer 43 is located in the same layer as the contact layers 23 and 230, and is formed in the same steps in which these layers are formed. The via layer 45 is located in the same layer as the contact layers 25 and 250, and is formed in the same steps in which these layers are formed.

The uppermost metal wiring layer (i.e., a layer that includes the fuses 26, the dummy fuses 28 and the third metal wiring layer 46 of the guard ring 40) is preferably covered by a protection layer 36. The protection layer 36 may be composed of a silicon oxide layer, a silicon nitride layer or the like. A passivation layer 38 that is composed of a silicon oxide layer, a silicon nitride layer or the like may be formed on the protection layer 36. The passivation layer 38 includes a fuse opening section 50 in a predetermined region within the guard ring 40. A laser beam can be irradiated on the fuses 26 through the fuse opening section 50.

In the present embodiment, the circuit wiring layer 200 and the other wiring layers can be formed and patterned in the same steps in which the wiring layers located respectively at the corresponding same levels in the circuit section are formed. Accordingly, the circuit wiring layer 200 and the other wiring layers may have the same layer structures as those of the wiring layers of the circuit section 60 that are located respectively at the same levels of these layers.

With the semiconductor device in accordance with the present embodiment, since the circuit wiring layer 200 is disposed in the fuse section 100, the area occupied by the circuit wiring layer can be reduced, compared to the case in which a fuse section and a circuit wiring layer are provided in different regions, further miniaturization and higher integration can be accommodated, and the degree of freedom in designing the circuit can be improved.

Also, since the dummy fuses 28 are formed in the uppermost wiring layer corresponding to the region where the circuit wiring layer 200, the wiring layer 240 below the dummy fuses 28 for example can avoid an impact of the irradiation of laser beam.

Furthermore, the circuit wiring layer 200 composed of polysilicon as a main composition is connected to the metal wiring layers 220 and 240, the resistance of the circuit wiring layer 200 can be reduced.

One embodiment of the present invention has been described above, but the present invention is not limited to this embodiment, and can accommodate a variety of measures within the scope of the subject matter of the present invention.

For example, the fuses 26 may be acceptable if they are formed in a layer different from that of the circuit wiring layer 200, and can be formed at the same level as the second or third wiring layer. Also, the circuit wiring layer 200 may be acceptable if it is formed in a layer below the fuses 26, is not limited to a conductive layer that is composed of polysilicon as a main composition, and may be formed at the same level as the second or third wiring layer (metal wiring layer).

Also, the embodiment of the present invention is described using a semiconductor device that includes a conductive layer composed of polysilicon as a main composition and a third metal wiring layer. However, embodiments of the present invention are also applicable to a semiconductor device having two or more conductive layers.

In addition, it will be understood that a variety of additional modifications may be made to the embodiments described above within the scope of the present invention.

What is claimed:

1. A semiconductor device comprising:
   a fuse section including a plurality of fuses and dummy fuses, wherein at least one dummy fuse is positioned between two of the fuses; and
   a fuse wiring layer electrically connected to at least one of the fuses and not electrically connected to any of the dummy fuses; and
   a circuit wiring layer separated from the at least one dummy fuse by a dielectric layer, the circuit wiring layer being not electrically connected to the at least one dummy, wherein at least a portion of the circuit wiring layer is disposed directly under at least one dummy fuse.

2. A semiconductor device according to claim 1, further comprising a circuit section separate from the fuse section, the circuit section including two or more wiring layers on a semiconductor substrate, wherein the fuses and the circuit wiring layer are formed in layers at the same levels as two layers of the two or more wiring layers comprising the circuit section.

3. A semiconductor device according to claim 1, wherein the circuit wiring layer extends in a direction that is the same as a direction in which the fuses extend.

4. A semiconductor device according to claim 2, wherein the circuit wiring layer is disposed in a direction that is the same as a direction in which the fuses extend.

5. A semiconductor device according to claim 1, wherein the circuit wiring layer comprises a first conductive layer electrically connected to other conductive layers in the device.

6. A semiconductor device according to claim 3, wherein the circuit wiring layer comprises a material containing polysilicon as a main composition.

7. A semiconductor device according to claim 5, further comprising, at least in the fuse section, a metal wiring layer disposed in a layer different from the circuit wiring layer and connected to the circuit wiring layer, wherein the metal wiring layer and the circuit wiring layer are both positioned below a layer in which the fuses are formed.

8. A semiconductor device comprising:
   a fuse section including a layer with a plurality of fuses and dummy fuses formed therein, the plurality of fuses and dummy fuses being formed at a first level in the semiconductor device, wherein at least one dummy fuse is positioned between two of the fuses; and
   a circuit wiring layer that is not electrically coupled to the dummy fuses, wherein the circuit wiring layer is electrically coupled to a portion of the semiconductor device other than the fuses and dummy fuses, wherein the circuit wiring layer is not disposed at the first level in the semiconductor device, and wherein at least a portion of the circuit wiring layer is disposed directly under at least one dummy fuses.

9. A semiconductor device as in claim 8, wherein the circuit wiring layer is formed below the first level in the semiconductor device.

10. A semiconductor device as in claim 8, further comprising at least one conducting layer disposed between the dummy fuses and the circuit wiring layer, wherein the at least one conducting layer is in electrical contact with the circuit wiring layer.

11. A semiconductor device as in claim 10, further comprising a guard ring extending around the fuses and dummy fuses.

12. A semiconductor device as in claim 11, wherein the guard ring, the fuses and the dummy fuses are formed of the same material.

13. A semiconductor device as in claim 1, wherein the circuit wiring layer is not electrically connected to the plurality of fuses and dummy fuses.

14. A semiconductor device according to claim 8, wherein the circuit wiring layer is not electrically to the dummy fuses.

15. A semiconductor device according to claim 14, wherein the circuit wiring layer is not electrically connected to the fuses.

* * * * *